United States Patent
Chen et al.

(10) Patent No.: US 10,100,437 B2
(45) Date of Patent: Oct. 16, 2018

(54) METHOD FOR MANUFACTURING N-TYPE SEMICONDUCTOR ELEMENT FOR COOLING OR HEATING DEVICE

(71) Applicants: Zhiming Chen, Xiuwen County (CN); Wei Gu, Suzhou (CN); SUZHOU WEIYUAN NEW MATERIAL TECHNOLOGY CO., LTD., Suzhou (CN)

(72) Inventors: Zhiming Chen, Xiuwen County (CN); Wei Gu, Suzhou (CN)

(73) Assignees: Zhiming Chen, Guizhou (CN); Wei Gu, Jiangsu (CN); Suzhou Weiyuan New Material Technology Co., Ltd., Jiangsu (CN)

( * ) Notice: Subject to any disclaimer, the term of this patent is extended or adjusted under 35 U.S.C. 154(b) by 395 days.

(21) Appl. No.: 14/998,282

(22) Filed: Dec. 24, 2015

(65) Prior Publication Data

US 2016/0130726 A1 May 12, 2016

Related U.S. Application Data

(63) Continuation of application No. PCT/CN2014/078441, filed on May 26, 2014.

(30) Foreign Application Priority Data

Jun. 25, 2013 (CN) .......................... 2013 1 0257878

(51) Int. Cl.
| | |
|---|---|
| *C30B 15/00* | (2006.01) |
| *C30B 29/46* | (2006.01) |
| *H01L 35/34* | (2006.01) |
| *B28D 5/00* | (2006.01) |
| *C30B 15/10* | (2006.01) |
| *C30B 15/14* | (2006.01) |
| *C01B 19/00* | (2006.01) |

(52) U.S. Cl.
CPC ................ *C30B 29/46* (2013.01); *B28D 5/00* (2013.01); *C01B 19/007* (2013.01); *C30B 15/10* (2013.01); *C30B 15/14* (2013.01); *H01L 35/34* (2013.01)

(58) Field of Classification Search
CPC ......... C30B 15/00; C30B 15/10; C30B 15/14; C30B 29/00; C30B 29/10; C30B 29/46; C30B 11/00; C30B 11/003; C30B 11/006; C30B 13/00; C30B 13/16; C30B 13/28; B28D 5/00; C01B 19/007; H01L 35/34
USPC ...... 117/11, 13, 19, 53, 73, 81–83, 937, 939
See application file for complete search history.

(56) References Cited

U.S. PATENT DOCUMENTS

| | | | |
|---|---|---|---|
| 6,274,802 B1* | 8/2001 | Fukuda ................... | H01L 35/16 136/201 |
| 2006/0243314 A1* | 11/2006 | Ota ..................... | B22D 11/0611 136/200 |

FOREIGN PATENT DOCUMENTS

| | | |
|---|---|---|
| CN | 1104375 A | 6/1995 |
| CN | 1148735 A | 4/1997 |
| CN | 1488572 A | 4/2004 |
| CN | 1757774 A | 4/2006 |
| CN | 101613814 A | 12/2009 |
| CN | 102088058 A * | 6/2011 |
| CN | 102088058 A | 6/2011 |
| CN | 103456877 A | 12/2013 |
| JP | 2003-060245 A | 2/2003 |
| JP | 2004-63768 A | 2/2004 |
| JP | 2006-222161 A | 8/2006 |
| JP | P4496687 B2 | 4/2010 |
| WO | WO 00/74149 A1 | 12/2000 |

OTHER PUBLICATIONS

Chinese International Search Report of corresponding International PCT Application No. PCT/CN2014/078441, dated Sep. 3, 2014.
The extended European Search Report and Search Opinion of corresponding European application No. 14816818.0-1375/3016155 PCT/CN2014/078441, dated Nov. 2, 2016.
Kitagawa, Hiroyuki et al., "Preparation of $Bi_2Te_3$-related Thermoelectric Materials by Plastic Deformation" Journal of the Japan Institute of Metals and Materials; vol. 69, No. 1; (2005); pp. 164-169.
Yang, J.Y. et al., "Thermoelectric properties of n-type $(bi_2Se_3)_x(Bi_2Te_3)_{1-x}$ prepared by bulk mechanical alloying and hot pressing" Journal of Alloys and Compounds; vol. 312; Issues 1-2; (2000); pp. 326-330.

* cited by examiner

*Primary Examiner* — Kenneth A Bratland, Jr.
(74) *Attorney, Agent, or Firm* — J.C. Patents

(57) ABSTRACT

Disclosed is a method for manufacturing N-type semiconductor element for cooling or heating device, the N-type semiconductor element is made of tellurium, bismuth and selenium material, firstly, smashing and grinding the tellurium, bismuth and selenium material to be 2000 meshes or more; and then, according to the proportion of each material in parts by weight, proportioning the materials to obtain a mixture, the proportion thereof is: 40 to 44 parts of tellurium, 53 to 57 parts of bismuth and 28 to 32 parts of selenium. During operation, the temperature difference between the two ends thereof is larger, and through a test, the temperature difference between the cold end and the hot end reaches about 73° C. to 78° C. Therefore, the N-type semiconductor element has the advantages of high operation efficiency and lower energy consumption. The N-type semiconductor element is particularly suitable for manufacturing a semiconductor cooling or heating device.

7 Claims, No Drawings

//METHOD FOR MANUFACTURING N-TYPE SEMICONDUCTOR ELEMENT FOR COOLING OR HEATING DEVICE

CROSS-REFERENCE TO RELATED APPLICATIONS

This application is a continuation of International Application No. PCT/CN2014/078441, filed on May 26, 2014, which claims priority to Chinese Patent Application No. 201310257878.9, filed on Jun. 25, 2013, both of which are hereby incorporated by reference in their entireties.

TECHNICAL FIELD

The present invention relates to a method for manufacturing an N-type semiconductor element for a cooling or heating device, which belongs to the field of semiconductor manufacturing technology.

BACKGROUND

The feature, that different temperatures are generated at a hot end and a cold end of a P-type semiconductor and an N-type semiconductor while being energized, has been widely applied in the field of manufacturing semiconductor cooling or heating devices. In the prior art, when manufacturing an N-type semiconductor, it is presently known that group V elements such as phosphorus, arsenic or antimony are generally incorporated in pure silicon crystal to replace positions of silicon atoms in the lattice, and thus an N-type semiconductor is formed. When the N-type semiconductor element manufactured with the traditional method is applied in manufacturing a cooling or heating device, the major problems are: the temperature difference between the two ends is relatively small (the temperature difference between the hot end and the cold end is generally about 60 degrees), the cooling or heating efficiency is poor, and the energy consumption is large; besides, since the head end and the tail end of the existing N-type semiconductor element cannot be distinguished from each other, when being applied in manufacturing the cooling or heating device, the head ends and the tail ends are connected disorderedly, an orderly head-to-tail connection thereof cannot be achieved, therefore, the electrical power conversion of the semiconductor element does not work efficiently, thereby decreasing the working efficiency. Accordingly, the effect of usage of the existing N-type semiconductor element for a cooling or heating device is less than desired.

SUMMARY

In order to overcome the defects in the prior art, an object of the present invention is to provide a method for manufacturing an N-type semiconductor element for a cooling or heating device, so that the temperature difference between two ends thereof during operation is larger, the operation efficiency is higher, and the energy consumption is lower.

The present invention is implemented as follows: in the method for manufacturing an N-type semiconductor element for a cooling or heating device according to the present invention, the N-type semiconductor element is made of tellurium material, bismuth material and selenium material, firstly, smashing and grinding the tellurium material, the bismuth material and the selenium material to be 2000 meshes or more than 2000 meshes; and then, according to the proportion of each material in parts by weight, proportioning the materials to obtain a mixture, the proportion thereof is 40 to 44 parts of tellurium, 53 to 57 parts of bismuth and 28 to 32 parts of selenium; putting the evenly-mixed mixture in a glass tube for smelting, and drying the glass tube together with the materials for draw-off and vacuum-pumping process, then placing the glass tube with the mixture into a rocking furnace for vacuum rocking smelting at a smelting temperature from 650 to 750° C. with a smelting time of 15 to 25 minutes, taking the glass tube out of the rocking furnace and cooling down naturally to room temperature; placing vertically the glass tube cooled naturally together with the material in a crystal pulling furnace for a crystal pulling process, at a crystal pulling temperature from 600 to 750° C. at a speed of 2 to 3 cm per hour, the time of crystal pulling is controlled within 16 to 20 hours, then an N-type semiconductor crystal bar is manufactured after completion of the crystal pulling, the N-type semiconductor element is obtained after slicing, cutting and pelletizing the manufactured N-type semiconductor crystal bar.

The preferable proportion of each material in parts by weight is: 41 to 43 parts of tellurium, 54 to 56 parts of bismuth and 29 to 31 parts of selenium.

The optimal proportion of each material in parts by weight is: 42 parts of tellurium, 54.9 parts of bismuth and 31 parts of selenium.

Tellurium tetraiodide material for hardening and tempering is added into the above mixture, in 0.009 to 0.1 times of the total weight of the mixture.

The manufactured N-type semiconductor crystal bar is a cone-shaped crystal bar of which one end has a large diameter and the other end has a small diameter, the cone-shaped N-type semiconductor crystal bar is cut into slices with the traditional slicing tool to obtain wafers with the same thickness, the small diameter end of the wafer is the head end the large diameter end is the tail end, and then a color mark is made on the tail end surface of each wafer; and then the conical surface of each wafer is cut and pelletized using a numerical control cutting and pelletizing method, each wafer is cut and pelletized to the same polygonal cylindrical shape, the polygonal cylindrical N-type semiconductor is the N-type semiconductor element exclusively for a cooling or heating device.

The polygonal cylinder is a quadrangular, square, regular hexagonal, regular octagonal, regular decagonal or regular dodecagonal cylinder.

The length of the glass tube for smelting is 85 to 100 cm.

Due to the above technical solution, in view of the feature of the cooling or heating device in use, the present invention is directed to manufacturing an N-type semiconductor element for a cooling or heating device, by adopting a special formulation and manufacturing process, compared with the prior art, when the N-type semiconductor element of the present invention is in operation, the temperature difference between the two ends thereof is larger, and through a test, when the N-type semiconductor element is in operation, the temperature difference between the cold end and the hot end thereof reaches about 73° C. to 78° C., therefore, the present invention has the advantages of high operation efficiency and lower energy consumption; besides, since the tail end and the head end of the N-type semiconductor element of the present invention can be easily distinguished, during installation and operation, the N-type semiconductor element can be orderly connected in a head-to-tail sequence, thus avoiding the disordered connection between the head end and the tail end due to undistinguishable head and tail end when connecting the N-type semiconductor element in the prior art. When the N-type semiconductor element of the present invention is used to manufacture a cooling or heating device, an orderly connection in a head-to-tail sequence can be achieved in a convenient way, thereby effectively improving working efficiency of all the semiconductor elements, as well as cooling or heating effect of the entire device.

DESCRIPTION OF EMBODIMENTS

The present invention is described below in further detail with reference to the embodiments.

The embodiments are as follows: in the method for manufacturing an N-type semiconductor element for a cooling or heating device according to the present invention, the N-type semiconductor element is made of tellurium material, bismuth material and selenium material, firstly, smashing and grinding the tellurium material, the bismuth material and the selenium material to be 2000 meshes or more than 2000 meshes; and then, according to the proportion of each material in parts by weight, proportioning the materials to obtain a mixture, the proportion thereof is: 40 to 44 parts of tellurium, 53 to 57 parts of bismuth and 28 to 32 parts of selenium; putting the evenly-mixed mixture in a glass tube for smelting (in order to facilitate cutting the crystal bar, the length of the glass tube for smelting is controlled within the range of 85 to 100 cm), and drying the glass tube together with the materials for draw-off and vacuum-pumping process, then placing the glass tube with the mixture into a rocking furnace for vacuum rocking smelting at a smelting temperature from 650 to 750° C. with a smelting time of 15 to 25 minutes, taking the glass tube out of the rocking furnace and cooling down naturally to the room temperature; placing vertically the glass tube cooled naturally together with the material in a crystal pulling furnace for a crystal pulling process, at a crystal pulling temperature from 600 to 750° C. at a speed of 2 to 3 cm per hour, the time of crystal pulling is controlled by 16 to 20 hours, then the N-type semiconductor crystal bar is manufactured after completion of the crystal pulling, the N-type semiconductor element is obtained after slicing, cutting and pelletizing the manufactured N-type semiconductor crystal bar.

The preferable proportion of each material in parts by weight is: 41 to 43 parts of tellurium, 54 to 56 parts of bismuth and 29 to 31 parts of selenium.

The optimal proportion of each material in parts by weight is: 42 parts of tellurium, 54.9 parts of bismuth and 31 parts of selenium.

To meet the operating requirements of the semiconductor resistor, tellurium tetraiodide material for hardening and tempering can be added into the mixture, controlled in 0.009 to 0.1 times of the total weight of the mixture according to needs of use.

During manufacturing, the N-type semiconductor crystal bar is made to a cone-shaped crystal bar (the diameter of the small diameter end of the cone-shaped crystal bar can be determined according to the needs of use, and the conicity is controlled between 2 and 5 degrees) of which one end has a large diameter and the other end has a small diameter, the cone-shaped N-type semiconductor crystal bar is cut into slices with the traditional slicing tool to obtain wafers with the same thickness, the small diameter end of the wafer is the head end the large diameter end is the tail end, and then a color mark is made on the tail end surface of each wafer with colors made of conductive materials (for example, color materials made of conductive materials, such as copper, aluminium or silver); and then the conical surface of each wafer is cut and pelletized using a traditional numerical control cutting and pelletizing method, each wafer is cut and pelletized to the same polygonal cylindrical shape, the polygonal cylindrical N-type semiconductor is the N-type semiconductor element exclusively for a cooling or heating device.

The polygonal cylinder can be made as a quadrangular, square, regular hexagonal, regular octagonal, regular decagonal or regular dodecagonal cylinder according to the needs of use.

What is claimed is:

1. A method for manufacturing an N-type semiconductor element for a cooling or heating device, wherein, the N-type semiconductor element is made of tellurium material, bismuth material and selenium material, the method comprising, firstly, smashing and grinding the tellurium material, the bismuth material and the selenium material to be 2000 meshes or more than 2000 meshes; and then, according to proportion of each material in parts by weight, proportioning the materials to obtain a mixture, wherein the proportion thereof is: 40 to 44 parts of tellurium, 53 to 57 parts of bismuth and 28 to 32 parts of selenium; putting the evenly-mixed mixture in a glass tube for smelting, and drying the glass tube together with the materials for draw-off and vacuum-pumping process, then placing the glass tube with the mixture into a rocking furnace for vacuum rocking smelting at a smelting temperature from 650 to 750° C. with a smelting time of 15 to 25 minutes, taking the glass tube out of the rocking furnace and cooling down naturally to the room temperature; placing vertically the glass tube cooled naturally together with the material in a crystal pulling furnace for a crystal pulling process, at a crystal pulling temperature from 600 to 750° C. at a speed of 2 to 3 cm per hour, a time of crystal pulling is controlled within 16 to 20 hours, then the N-type semiconductor crystal bar is manufactured after completion of the crystal pulling, the N-type semiconductor element is obtained after slicing, cutting and pelletizing the manufactured N-type semiconductor crystal bar.

2. The method for manufacturing an N-type semiconductor element for a cooling or heating device according to claim 1, wherein, the proportion of each material in parts by weight is: 41 to 43 parts of tellurium, 54 to 56 parts of bismuth and 29 to 31 parts of selenium.

3. The method for manufacturing an N-type semiconductor element for a cooling or heating device according to claim 1, wherein, the proportion of each material in parts by weight is: 42 parts of tellurium, 54.9 parts of bismuth and 31 parts of selenium.

4. The method for manufacturing an N-type semiconductor element for a cooling or heating device according to claim 1, wherein, tellurium tetraiodide material for hardening and tempering is added into the mixture, in 0.009 to 0.1 times of the total weight of the mixture.

5. The method for manufacturing an N-type semiconductor element for a cooling or heating device according to claim 1, wherein, the manufactured N-type semiconductor crystal bar is a cone-shaped crystal bar of which one end has a large diameter and the other end has a small diameter, the cone-shaped N-type semiconductor crystal bar is cut into slices with the traditional slicing tool to obtain wafers with the same thickness, the small diameter end of the wafer is the head end the large diameter end is the tail end, and then a color mark is made on the tail end surface of each wafer; and then the conical surface of each wafer is cut and pelletized using a numerical control cutting and pelletizing method, each wafer is cut and pelletized to the same polygonal cylindrical shape, the polygonal cylindrical N-type semiconductor is the N-type semiconductor element exclusively for the cooling or heating device.

6. The method for manufacturing an N-type semiconductor element for a cooling or heating device according to claim 5, wherein, the polygonal cylinder is a quadrangular, square, regular hexagonal, regular octagonal, regular decagonal or regular dodecagonal cylinder.

7. The method for manufacturing an N-type semiconductor element for a cooling or heating device according to claim 1, wherein, length of the glass tube for smelting is 85 to 100 cm.

* * * * *